TRANSISTOR FOR OPERATION IN REGULATING CIRCUITS WITH EMITTER BASE JUNCTION OF SAWTOOTH, CONCAVE, OR WEDGE SHAPE CONFIGURATION
Original Filed Oct. 19, 1965 2 Sheets-Sheet 1
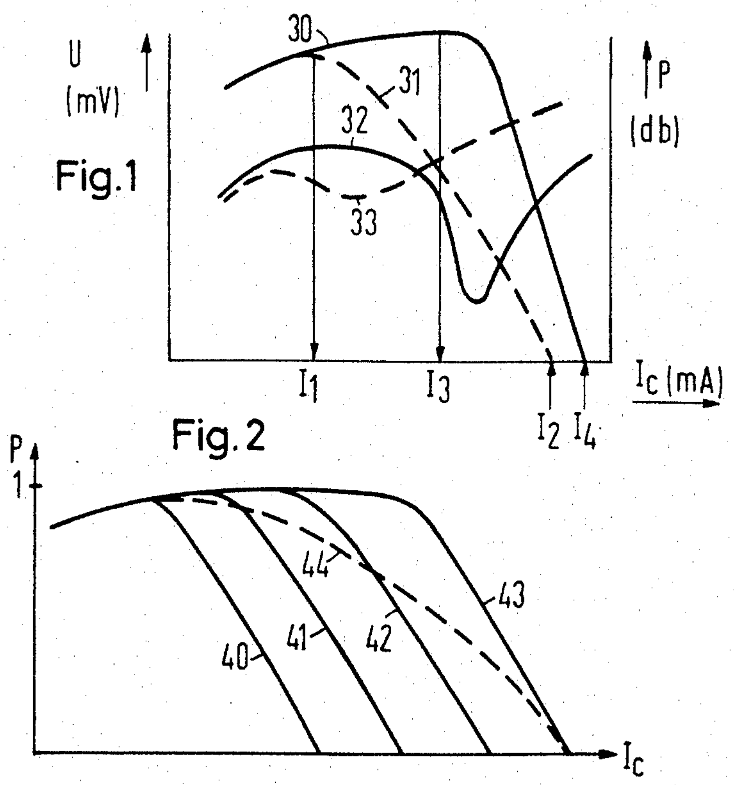
Fig.1, Fig.2
Fig.3
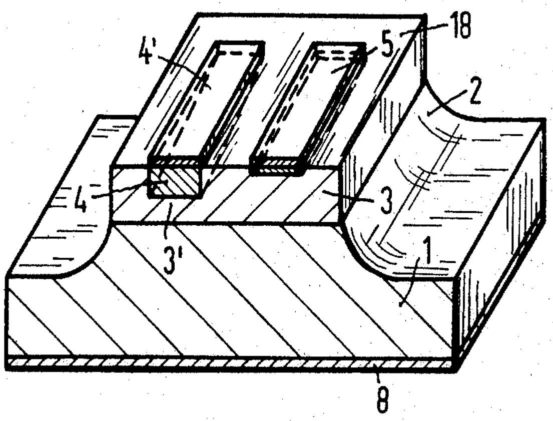
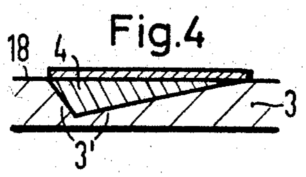
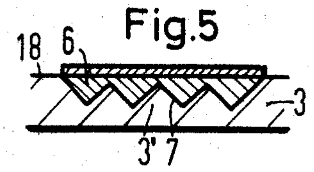
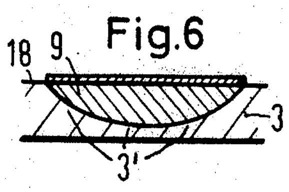

Nov. 25, 1969 H. RUCHARDT ET AL 3,480,845

TRANSISTOR FOR OPERATION IN REGULATING CIRCUITS WITH EMITTER BASE JUNCTION OF SAWTOOTH, CONCAVE, OR WEDGE SHAPE CONFIGURATION

Original Filed Oct. 19, 1965 2 Sheets-Sheet 2

United States Patent Office 3,480,845
Patented Nov. 25, 1969

3,480,845

TRANSISTOR FOR OPERATION IN REGULATING CIRCUITS WITH EMITTER BASE JUNCTION OF SAWTOOTH, CONCAVE, OR WEDGE SHAPE CONFIGURATION

Hugo Ruchardt, Gauting, and Hans Hargasser and Winfried Meer, Munich, Germany, assignors to Siemens Aktiengesellschaft, Munich, Germany, a corporation of Germany Continuation of application Ser. No. 497,771, Oct. 19, 1965. This application Feb. 5, 1968, Ser. No. 703,185
Claims priority, application Germany, Dec. 1, 1964, S 94,396
Int. Cl. H01l 3/00, 5/02
U.S. Cl. 317—234 6 Claims

ABSTRACT OF THE DISCLOSURE

A regulating transistor having a crystalline semiconductor body includes an emitter zone and a base zone and a collector zone, the collector zone having adjacent to the base zone a high resistivity region; and means for injecting charge-carrier non-uniformity from the emitter zone into the base zone, the means comprising a junction between the emitter zone and the base zone extending over the area of charge-carrier injection between the emitter zone and the base zone, the junction having a wedge-shaped, concave-shaped or saw-toothed outline.

This is a continuation of Ser. No. 497,771 filed Oct. 19, 1965, now abandoned.

Our invention relates to transistors and has for its main object to improve the transistor operational characteristics for regulating purposes.

The invention will be described with reference to the accompanying drawings in which:

FIGS. 1 and 2 are explanatory graphs.

FIG. 3 shows perspectively and in cross section an embodiment of a regulating transistor according to the invention.

FIGS. 4, 5 and 6 illustrate respective detail modifications of such a transistor in section.

Figures 7, 8, 9, 10, 11, 12, 13:
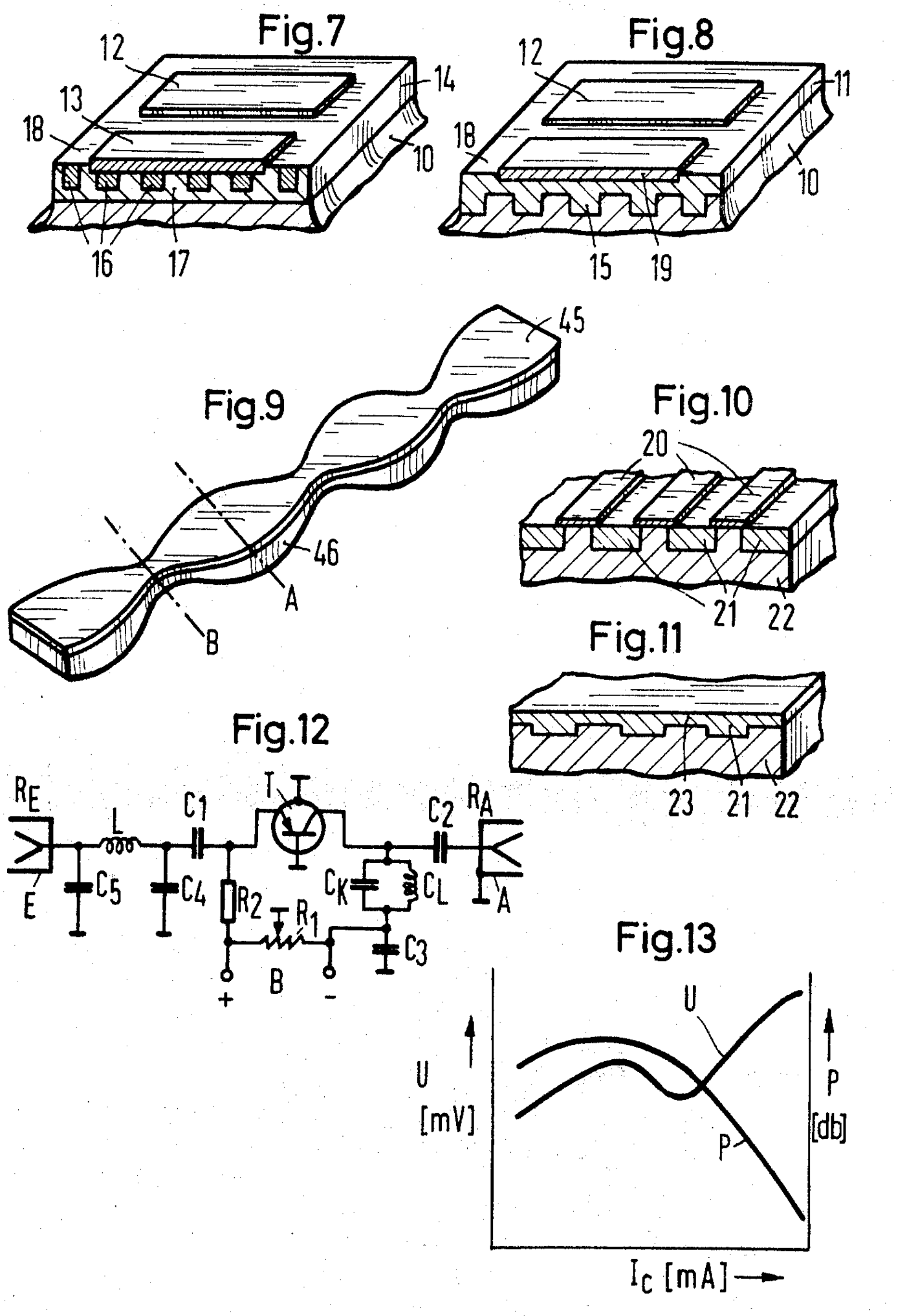
FIGS. 7 and 8 show two different embodiments of transistors according to the invention, also perspectively and in section.
FIG. 9 illustrates separately and in schematic perspective an emitter zone separate from a transistor of the planar type according to the invention.
FIGS. 10 and 11 are perspective and sectional views of two embodiments of planar transistors according to the invention.
FIG. 12 illustrates an example of a regulating network of which a transistor according to the invention forms an essential part.
FIG. 13 is an explanatory graph relating to the regulating performance of a mesa transistor as shown in FIG. 3.

Receiver circuits often have their first amplifying stage equipped with electronically regulatable high-frequency amplifying transistors. In the frequency range above 30 c.p.s. it is customary to couple the receiving antenna with the input of the first transistor amplifier stage through transforming members whose band widths are large relative to the total band width of the receiver. This type of circuitry calls for regulatable transistors whose cross-modulation behavior is satisfactory throughout the entire regulating range.

An essential cause of cross modulation is the nonlinear input characteristic of a transistor. Cross modulation designates the phenomenon that when the signal of a socalled useful transmitter is being received, the modulation of a different, interfering transmitter operating on a different frequency, is observed, whereas when the carrier wave of the useful frequency is absent, such an interfering modulation is not ascertainable. Trouble of this kind, therefore, cannot be eliminated by any selectivity of subsequently effective intermediate-frequency filters or other frequency-selective components. In the following the term "permissible spurious voltage for 1% spurious modulation of the useful carrier" will be employed. The permissible spurious voltage is the signal voltage of the interfering transmitter which will modulate the useful carrier wave by 1%.

The HF-regluating transistors employed in the mentioned receiver circuits should be so designed that they attain a highest feasible value of permissible spurrious voltage in the operating range above referred to.

The non-linearity in the amplification characteristic of a transistor, being essential to the phenomenon of cross modulation, is represented by the function $P=f(I_C)$. For explanation, reference is made to FIG. 1 showing the curve of the power amplification (30 or 31) and of the permissible spurious voltage (curve 32 or 33) as a function of the collector current $I_C$, in ma. Denoted by P is the power amplification of a transistor measured in db. Denoted by U is the voltage of a modulated transmitter which supplies a spurious voltage and causes a defined modulation of the signal from a useful transmitter. The curvature of the function $P=f(I_C)$ constitutes a measure of the cross modulation or of the permissible spurious voltage. To make certain that the spurious voltage permissible or required for a given disturbance of the useful signal is as large as feasible in the entire regulating range, the curve indicative of the amplifying characteristic of the transistor should have the smallest possible curvature.

The foregoing considerations apply to regulating transistors operated in "upwardly" regulating circuits; that is, the change in amplification with such transistors is due to the fact that the steepness of the characteristic decreases with an increase in emitter or collector current. The full-line curves in FIG. 1 relate to the power amplification and the corresponding spurious voltage as a function of the collector current for a normal transistor without special regulating properties, whereas the broken-line curves indicate the course particularly desirable for a regulating transistor.

In order to achieve improved regulating characteristics of transistors as represented, for example, by the differences between the full-line curves and broken-line curves in FIG. 1, our invention requires a particular doping of the collector zone and base zone, and also involves a preferred geometry of the emitter, by virtue of which the regulating properties of the transistor are made to approach the ideal conditions just discussed with reference to FIG. 1.

To facilitate explaining this more in detail, it will be useful to briefly look at a transistor, for example the one shown in FIG. 3. This transistor will at first be described only as to general features. A more detailed description, involving the modifications required by the present invention, will be given in a later place.

The collector zone of the transistor shown in FIG. 3 has a low-resistivity region 1 and a region 2 of lower dopant concentration which, therefore, is of high resistivity in comparison with region 1. The two regions 1 and 2 are integral. The region 2 forms part of the transistor mesa portion in which the base 3 is located, this base being of low resistivity in comparison with the high-resistivity collector region 2. Denoted by 4 is the emitter zone. The collector zone is contacted by a metal electrode 8. The base zone is contacted by a barrier-free electrode 5, and the emitter zone 4 by an electrode 4'.

The crystalline semiconductor body with its three zones the collector zone 1, 2, the base zone 3 the emitter zone 4, consists, for example, of germanium. The regions 1 and 2 may have p-type conductance, in which case the base zone 3 has n-type conductance, and the emitter zone 4 has p-type conductance. Consequently, respective p-n junctions are formed between collector and base, and between emitter and base.

While for the purpose of explanation a mesa transistor has been described, it will be understood that the following considerations and the essential features of the invention are not limited to this particular type but are of general applicability as will more fully appear hereinafter.

The regulating properties of a transistor largely depend upon the doping of the collector zone. According to the invention, the dopant density $N_c$ in for example the high-resistivity region 2 of the transistor shown in FIG. 3, is so chosen that at a collector current $I_c$ of a few ma., namely not more than 10 ma., the current density $j_c$ is already larger than the product of $v_g$ times $N_c$ times $q$ ($j_c > v_g \cdot N_c \cdot q$), wherein $v_g$ denotes the limit speed for the charge carriers injected from the emitter into the base zone at high field strength, this speed being about $3\text{–}6 \cdot 10^6$ cm./sec.; and $q$ denotes the elementary charge. In consequence, a change of the collector current $I_c$ causes a change in the effective width of the base zone and thus of the HF-amplifying gain.

For a given value of collector current $I_c$, the magnitude of the current density $j_c$ depends upon the injecting emitter area. Since the emitter area affects the electrical data of the transistor, particularly the limit frequency, the dopant density $N_c$ assumes different values dependent upon the particular electrical data, especially the frequency range, for which the transistor is dimensioned. If the injection along the injecting emitter area is inhomogeneous, there applies the equation $$I_c = \int^{F} \int_{0}^{E} j_c dF_E$$

which, for homogeneous injection, becomes simplified to:

$$I_c = j_c \cdot F_E$$

The transistor may be so designed that the collector zone is composed of a region adjacent to the base zone having the dopant density $N_c$ and a low-resistivity region adjacent to the collector electrode, this being the case in the example introductorily described above with reference to FIG. 3. In other transistors the two regions 1 and 2 may consist only of the high-resistivity material.

The selective HF-amplification of a transistor is physically determined by the relation $$P \approx \frac{f_T}{f^2 r_{bb'} C_{cb'}} \qquad (1)$$

wherein $r_{bb'}$ denotes the distributed resistance of the base, $C_{cb'}$ denotes the share of the collector capacitance which lies in series with $r_{bb'}$, and $f_T$ is the value of the frequency when the amplification in emitter configuration is equal to unity. A reduction of P for a given frequency $f$ is possible by reducing the numerator or increasing the denominator in Equation 1. For high frequencies the input and output impedances of a transistor are largely determined by the base distributed resistance or the collector capacitance. A change of these parameters for the purpose of gain regulation leads to changes in matching and to detuning of preceding or following circuit components. However, a modification of the transfer magnitude $f_T$ permits an optimal change in gain with smallest changes in impedance. For simplification, the effect of space-charge travel time can here be neglected, in which case the value of $f_T$ is inversely proportional to the base travel time according to the equation:

$$f_T \approx \frac{1}{2\pi \tau_L} \qquad (2)$$

The charge-carrier travel time $\tau_L$ is a quadratic function of the width of the field-free base traversed by diffusion, namely:

$$\tau_L \approx \frac{w^2}{D} \qquad (3)$$

wherein D denotes the diffusion constant of the minority carriers in the base volume and $w$ denotes the electrically effective base zone width.

A controlled and predetermined setting of the transfer magnitudes $f_T$ with the aid of the collector direct current can be effected by suitable doping of the collector zone. The space-charge region occurring during operation at the collector p-n junction, has a space-charge density $\rho_c$ which is proportional to the dopant density in the collector region and determined by the relation $$\rho_c = q \cdot N_c \qquad (4)$$

wherein $q$ denotes the elementary charge and $N_c$ the dopant density in the collector zone.

When the emitter injects a current into the base zone at a current density $j_c$ larger than the value determined by the relation $$j_c = v_g \cdot N_c \cdot q \qquad (5)$$

this value of current being passed to the collector, then the original collector space-charge region is reversely charged or displaced, and a widening of the field-free base zone and consequently of the electrically effective base width $w$ is obtained. In Equation 5, $v_g$ denotes the limit speed for the charge carriers in the semiconductor at high field strength, which amounts to approximately $3\text{–}6 \cdot 10^6$ cm./sec. It follows from the relation 3, that widening of the field-free base zone prolongs the carrier travel time, which according to relation 2 leads to reducing the magnitude $f_T$ and thus, according to relation 1, to a reduction in high-frequency amplification. This widening of the base and reduction in HF-amplification increases with increasing collector current $I_c$.

For reasons of power loss and stability of noise as well as constancy of impedance, it is essential to select the dopant concentration $N_c$ in the collector zone so low that the decline in amplification occurs even at a collector current of a few ma. (at most about 10 ma.).

The base widening or the reduction in HF-amplification may progress to a larger extent if the collector zone is given greater thickness.

As is shown in FIG. 3, a regulating transistor according to the invention may be designed as a pnp-transistor of the mesa type in which the p-type collector zone has a relatively high-resistivity region adjacent to the n-type base zone and a low-resistivity region adjacent to the collector electrode. The thickness of the base zone, for example, may be 1.5$\mu$ with an emitter area of 28 x 70$\mu^2$. In a germanium transistor thus dimensioned, the collector was doped with a dopant density of $4 \cdot 10^{14}$ atoms per cm.$^3$. This corresponds to a conductivity of 8 ohm-cm. The thickness of the layer between the low-resistivity collector region and the base zone was 50$\mu$. The transistor, used in a regulating circuit, afforded downward gain regulation from about 40 db at a frequency of about 200 c.p.s. The linear working line was fixed by a battery voltage of 12 v. and by a working resistance of 1K ohm.

Also essential to the regulating properties is the course of the dopant concentration along the current path in the collector zone. This course is supposed to be a continuous and only slightly variable function of the locality since the base widening must also occur in a steady and uniform manner to avoid non-linearities in amplification and thus the occurrence of cross modulation and similar disturbances. According to the invention, therefore, it is preferable to provide for constant dopant concentration within the collector zone or within the high-resistivity region of the collector zone.

The change in output impedance within the regulating circuit may also be kept small by keeping the dopant concentration higher in the collector region located between the high-resistivity region and the collector electrode. For example, the dopant concentration in the low-resistivity region 1 in FIG. 3, may amount to three to ten times that of the high-resistivity region 2.

A particularly favorable way of modifying the curves of power amplification and permissible spurious voltage in the manner explained above with reference to FIG. 1, is afforded by a transistor design in which the base doping and/or the emitter geometry are so chosen that the charge carrier injection into the base zone through the injecting emitter area is inhomogeneous. It has been found that for regulating transistors, in contrast to transistors for amplification of relatively large signals, it is of advantage to employ a design in which the injection along the emitter area is inhomogeneous. Such a transistor may be looked upon as being composed of a multiplicity of different respective component transistors, all connected in parallel with one another and having different component current densities, so that for different total current values $I_c$ the limit speed of the charge carriers and hence the regulating performance by base widening can be reliably achieved.

FIG. 2 shows schematically the amplification characteristics P of a number of such imaginary, different and parallel-connected component transistors. The amplification curves of these component transistors are represented at 40, 41, 42 and 43. The resultant is a considerably less sharply curved characteristic 44. In accordance with the considerably smaller curvature of the resultant curve 44, the cross-modulation properties of such a transistor are considerably improved.

To some extent, an inhomogeneous injection is obtained simply by virtue of the voltage drop along the base resistance which is caused by the base current $I_B$ since the emitter regions more remote from the base contact have a potential different from those closer to the base contact. Consequently, by special geometric desgin of the emitter and by dimensioning of the base zone, the downward regulation and the cross-modulation properties can be optimalized.

In order to provide for inhomogeneous injection, aside from the voltage drop along the base resistance, it is necessary to apply a transistor design in which the ratio of emitter doping to base doping possesses a gradient or varies over the emitter area. With a diffusion-alloyed transistor, this can be achieved, for example, by nonuniformly alloying the emitter p-n junction into the diffused base, which causes for example the formation of a trough- or wedge-shaped configuration of the base region remaining between the emitter and collector p-n junctions. A base produced by diffusion constrainedly has a dopant gradient perpendicular to the surface.

However, an inhomogeneous injection along the emitter may also be achieved if the base is inhomogeneously doped parallel to the crystal surface from which the emitter is alloyed into the crystal. That is, an inhomogeneous injection is thus obtainable in cases where the base zone also possesses dopant gradient perpendicular to the dopant gradient resulting from the diffusion of the base zone. In such cases the doping in the base zone may vary for example periodically, or the junction between base zone and collector zone may be given a stepped shape, so that the thickness of the base zone parallel to the semiconductor surface is not uniform. In these cases, too, the downward gain regulation by base widening commences at relatively low collector currents in certain regions of the base zone, namely in the more weakly doped regions where the current density is relatively large. As a result, a displacement of the amplification maximum toward small collector currents of the transistor is again attained. This, as already explained, has the consequence of causing a reduced curvature in the amplification characteristic and thus increases the permissible spurious voltage.

In a transistor whose base zone is inhomogeneously doped parallel to the crystal surface, the emitter may be uniformly alloyed or diffussed into the crystal so that the injecting area is essentially parallel to the crystal surface. According to a further feature of the invention, however, it is also possible to achieve the objects of the present invention by alloying an emitter into such an inhomogeneously doped base, so that the emitting area does not extend parallel to the semiconductor surface. The emitter geometry may then be so chosen that it further increases this current density in those regions of the base zone where a higher current density exists because of inhomogeneous doping. This augments the displacement of the amplification maximum toward lower collector currents so that a desired course of the amplification curve is achieved without the necessity of adding smoothing components.

In the regulating transistor according to the invention illustrated in FIG. 3, the residual base zone 3′ between the emitter and collector junctions is wedge shaped and has an inhomogeneously injecting emitter area. This mesa transistor, partly described above, is cut in the conventional manner from a relatively large semiconductor wafer or slice. Denoted by 5 is the base contact. The emitter zone 4 located beneath the emitter contact 4′ has a wedge-shaped configuration, and this results in the corresponding wedge-shaped configuration of the base region 3′ between the emitter p-n junction and the collector p-n junction. As mentioned, this transistor may consist of germanium, the zones 1, 2, 4 having p-type conductance and the base zone 3 n-type conductance.

Shown in FIG. 4 is a cross section vertically through the emitter and base zone of the transistor according to FIG. 3. In those regions of the base zone that are adjacent to the region where the emitter zone has great penetrating depth, even slight values of collector current are sufficient for attaining a collector current density leading to the desired downward regulation of the base widening.

Shown in FIG. 5 is a cross section through an emitter and base zone in a transistor otherwise corresponding to FIG. 3, in which the junction between the remaining base zone 3′ and the emitter zone 6 has a sawtooth-shaped configuration.

FIG. 6 shows a section in the same plane as FIG. 4 relating to a modification of the transistor according to FIG. 3 in which the remaining base zone 3′ adjacent to the emitter zone 9 has the shape of a trough of arcuate sectional configuration.

Shown in FIG. 7 is the mesa of another transistor whose external shape generally corresponds to that of FIG. 3. Denoted by 10 in FIG. 7 is the p-conducting high resistivity region of the collector zone adjacent to the base zone 14 which carries the base contact 12. The emitter contact is denoted by 13. In this embodiment the regions of the base zone denoted by 16 and the base-zone regions denoted by 17 are doped differently from each other, that is, those portions of the base zone that are identified by the same hatching have the same doping, whereas differently hatched portions are doped differently from each other. Thus, the same direction of hatching in FIG. 7 denotes that the respective portions are doped to the same type of conductance and substantially the same specific resistance. Consequently, the base zone 14 possesses, at least in the region adjacent to the emitter, a dopant density which periodically varies parallel to the semiconductor surface. This periodic change in dopant density, of course, may also extend over the entire thicknes of the base zone.

FIG. 8 shows a further embodiment whose general design corresponds to the mesa transistor according to FIG. 3. The base zone 11 in FIG. 8, having n-type conductance and being located between the p-type collector zone 10 and the p-type emitter zone 19, is given a periodically varying thickness so that the collector-base junction has a stepped configuration 15.

The alternation in dopant density according to FIG. 7 or the stepped configuration need not necessarily be periodical but may also occur in an irregular sequence. In the embodiments shown in FIGS. 7 and 8 the emitter zone possesses an emitting area parallel to the crystal surface 18 as is visible in FIG. 8. However, the emitter may also be given a shape as exemplified in FIGS. 4 to 6.

Other embodiments of transistors according to the invention have an emitter structure of non-uniform width, as will be explained presently with reference to FIG. 9. In such cases the entire transistor may be looked upon as being composed of a combination of respectively different component transistors. The components of varied width are distinguished from one another predominantly by a different downward gain regulating performance due to different influences of the carrier marginal depletion. Such an emitter can be produced for example by the planar technique, that is, by diffusion through a mask whose openings have a width which is non-uniform, i.e. varies along the length of the openings. If care is taken that the width of the openings, at least in part, is not substantially larger than the intended emitter diffusion depth, then the emitter diffusion depth and thus the base thickness become non-uniform, whereby a transistor structure of favorable regulating properties is obtained.

FIG. 9 shows such an emitter zone removed from the other components of the transistor. Denoted by 45 is the emitter electrode, and by 46 the emitter zone whose thickness varies along the length of the zone. If one imagines the emitter zone to be sectioned at the localities A and B perpendicularly to the plane of illustration, then a comparison of the resulting cross sections will show that at the locality of cross section B the width as well as the thickness of the emitter are considerably smaller than in the cross-sectional plane A. Since the junction between base and collector zones is to extend parallel to the semiconductor surface, it follows that the thickness of the base zone beneath the emitter zone is larger in cross section B than in section A. The narrow and wide regions, however, need not alternate in periodic uniformity but may occur in any random sequence or arrangement.

A particularly favorable method of producing a transistor according to the invention is the following.

Used as starting material is a semiconductor wafer of a given conductance type having a relatively high conductivity and consequently a specific resistance of a few mohm-cm. Produced upon the wafer is a zone of the same conductance type, preferably by epitaxial growth, having a higher specific resistance. The resulting low-resistivity wafer with the high-resistivity layer is to constitute the collector zone of the transistor being produced. Thereafter, the dopant substance for the other conductance type is diffused into the surface of the high-resistivity layer thus partially doping the material to the reverse type of conductance. As a result, the base zone is produced. Now the surface of the diffusion layer is covered with a mask. Those areas of the diffusion layer that remain exposed through windows of the mask are then coated with a doping metal that produces a conductance type opposed to that of the diffusion layer. This metal is alloyed or diffused into the diffusion layer and forms the emitter zone. Thereafter the contact for the base zone is deposited at a slight distance from the emitter zone, likewise with the aid of a mask.

In order to obtain a non-uniform alloying of the emitter front, i.e. of the injecting emitter area, the semi-conductor surface into which the emitter is to be alloyed, is so cut that it is inclined toward the 111-plane of the semiconductor crystal. Since the base zone is produced by diffusion, it exhibits a doping gradient perpendicular to the surface. Since further the emitter area in accordance with the invention, exhibits a different depth of penetration with respect to this base zone, the doping in the base-zone regions adjacent to the emitter area is likewise different, due to the doping gradient perpendicular to the surface in the base zone. By virtue of this different doping in the base regions adjacent to the emitter zone along the injecting area, the above-explained varying injection and consequently different current density along the emitter area is secured, thus displacing the amplification maximum toward lower collector currents.

Depending upon which particular shape of the emitter area is to be produced, that is, whether a wedge shape, a stepped or a trough shape at the injecting area is desired, the inclination of the semiconductor surface toward the 111-plane of the semiconductor crystals is preferably either 1.5–2° or more than 4°. When alloying the emitter into the crystal, the alloying front, under suitable alloying conditions, largely preserves the orientation determined by the just-mentioned inclination and thus results in a differently deep penetration of the alloy-doped emitter which secures the desired inhomogeneous injection. For augmenting this inhomogeneity and thus further improving the gain regulating properties of the transistor, it is particularly advantageous if, with an inclination of the semiconductor surface axis toward the 111-plane of the crystal in the range of 1.5 to 2.0°, the inclination of the 111-plane extends in the direction of the emitter longitudinal axis. In accordance with this embodiment of the invention, therefore, the inclination of the 111-plane in the transistos shown in FIG. 3 is to extend perpendicularly to the plane of illustration, whereas this inclination is to extend in the plane of illustration in the arrangement shown in FIG. 4.

Described presently is an example of a method suitable for producing a transistor according to FIG. 3 or FIG. 4. Used as starting material are slices or wafers of monocrystalline p-type germanium of high conductivity corresponding to a few mohm-cm. The surface of the wafer is polished and is given an inclination of 1.5–2° relative to the 111-plane, and the direction of inclination of the 111-plane is then marked on the wafer. The polished surface is subsequently etched in the conventional manner. Thereafter a high-resistivity p-type germanium layer of more than 20$\mu$ thickness is epitaxially grown on the etched surface. The specific resistance of the epitaxial layer is 5–10 ohm-cm. Thereafter an n-type layer of 1.4–1.7$\mu$ and a resistance of 50–60 ohm per unit area is diffused into the p-type layer. Thereafter, elongated aluminum spots of about rectangular geometrical shape of 27 x 70$\mu$ size having a thickness of 3000 A. are vapor-deposited upon the n-type diffusion layer in high vacuum at 380° C. The aluminum spots are then alloyed into the diffusion layer at 500° C. The vapor deposition may also consist of a mixture of about 70% aluminum and about 30% gold. The vapor deposition is preferably conducted in such a manner that the longitudinal axis of the vapor-deposited spots is in the direction of the above-mentioned angular departure from the 111-plane. The doping metal for the emitter is vapor-deposited through a mask. If desired, several emitter electrodes, and consequently several transistors can be produced simultaneously in this manner. After vapor-deposition and alloying of the emitter, the mask is displaced a distance corresponding to the width of the width of the aluminum spots $+10\mu$. Then the base contact is vapor- deposited. The further steps of completing the transistor and attaching the collector electrode and the individual leads are performed in the conventional manner.

According to another method of producing transistors according to the invention, the starting material employed is a monocrystalline p-type germanium wafer whose surface has an inclination of more than 4° relative to the 111-plane. To be considered as special cases are angles of inclination at which the semiconductor surface into which other components are to be alloyed, coincide with the 110–plane or 100–plane. Attached to this surface, as mentioned in conjunction with the preceding example, is a high-resistivity epitaxial layer, an n-type base layer, an emitter electrode, and a base electrode. A departure of the surface from the 111-plane slightly larger than 4° results in a stepped alloying front at the emitter corresponding to FIG. 5. With a particularly large departure, that is, in the 110- or 100-plane parallel to the surface, the emitter alloying front assumes the shape of a curved trough contour as shown in FIG. 6. These shapes of the emitter alloying front afford relative to the regulating properties of the transistor similar advantages as the wedge shape described in conjunction with the embodiment of FIGS. 3 and 4. It is of minor significance whether the emitter alloy is rendered inhomogeneous in one or several steps. The first mentioned single-step embodiment, however, usually affords more uniform manufacturing results.

According to still another, particularly advantageous production method, the diffusion layer is produced by plural-step, particularly two-step diffusion. In this manner, an inhomogeneity of the resistance in the base layer parallel to the semiconductor surface is achieved.

One way of proceeding in the manner last mentioned is to first perform a base diffusion nearly up to the penetrating depth corresponding to the desired base thickness. Then the semiconductor surface is partially covered by a mask and a further diffusion is performed through the window openings of the mask, using dopant for producing the same conductance type as that of the first-produced diffusion layer. In this manner an alternating, particularly periodically changing, dopant density parallel to the semiconductor surface is obtained. During the second diffusion step, the penetrating depth of the first diffusion is driven further, down to the desired thickness of the base.

According to another mode of performing the method of the invention, the high resistivity layer, preferably produced epitaxially, is covered by a mask having strip-shaped openings extending, for example, parallel to each other. Through these elongated openings the dopant for the opposed conductance type is diffused into the high resistivity layer. Then the mask is removed, and a doping metal for producing the last-mentioned conductance type, is diffused into the crystal, preferably down to a lower diffusion depth than the diffusion first performed with the aid of the mask.

The above-mentioned two modes of the method according to the invention will be more specifically elucidated hereinafter with reference to two particularly favorable examples.

Employed as starting material is a monocrystalline, homogeneously doped, p-type and low-resistivity germanium disc of circular shape. First a high resistivity p-type layer is epitaxially produced on the disc and given a thickness of more than $20\mu$ and a specific resistance of 5–10 ohm-cm. The high resistivity epitaxial layer is then covered with a masking layer as shown in FIG. 8, particularly a coat of silicon dioxide of about $0.5\mu$ thickness. The conventional photo-varnish technique is applied for etching out of the $SiO_2$ layer a desired raster of windows, for example in the shape of thin strips of $5–10\mu$ width of which a few are shown in FIG. 10, the strips being spaced $5–10\mu$ from each other. Thereafter an n-type layer of about $1.5\mu$ thickness and a layer resistance of 40 ohm per $cm.^2$ is diffused through the windows into the crystal. After the masking oxide layer is removed chemically by etching, a second n-type layer of $1\mu$ thickness and a layer resistance of 80 ohm per unit area is diffused into the entire surface area of the crystal. The penetrating depth of the second diffusion layer, produced without masking, thus is smaller than that of the diffusion layer previously produced with the aid of the mask. An emitter having a size of 25 x $70\mu$ is alloyed into the double diffused base uniformly down to a depth of about $0.5\mu$. The base contact and the collector contact as well as the terminal leads are thereafter attached in the conventional manner.

The above-described double diffusion results in a device as exemplified in FIG. 11 showing only a portion of the transistor. Denoted by 22 is the collector zone, by 21 the base region produced by the first diffusion, and by 23 the region produced by the second diffusion. Since the second diffusion step for producing the region 23 is effected from the unmasked semiconductor surface, this step also results in partially covering the region 21 by the diffusion layer, namely down to the penetrating depth of the region 23.

In a further example, the process is started with a germanium disc as described above in conjunction with the preceding example. An n-type layer of about $1.5\mu$ thickness and a layer resistance of about 80 ohm per unit area is diffused into the high resistivity p-type layer of the disc. Before performing the second diffusion step, the diffusion layer is covered with a mask, consisting for example of a silicon dioxide coating. This mask may be shaped as exemplified by FIG. 10. The exposed surface portions of the semiconductor disc are now subjected to a second diffusion during which a further doping metal, preferably the same metal as used for the first diffusion, is indiffused down to a depth of $1–1.5\mu$, resulting in a layer resistance of about 40 ohm-cm. In this manner, a base layer of about $1.8\mu$ thickness and a periodically varying layer resistance is obtained. Now the masking is removed and the diffused germaninum disc is provided with the emitter contact, base contact, collector electrode and the necessary terminal leads. The example last described results in a transistor as exemplified by FIG. 7.

In the examples described in the foregoing, the emitter is uniformly alloyed or diffused into the crystal so that the injecting emitter surface extends virtually parallel to the semiconductor surface. The inhomogeneous doping of the base in the above-described methods according to the invention, therefore, is attained by a two-step diffusion of which at least one diffusion step is partially subjected to masking. The choice of the diffusion data and of the masking geometry permits favorably influencing the transistor regulating properties in a reproducible manner. With a suitable choice of the masking geometry it becomes unnecessary to calibrate the emitter on the inhomogeneously diffused base. The masking geometry employed for diffusion may be periodical and smaller than the emitter geometry, for example. As mentioned, an irregular variation in doping of the base zone parallel to the crystal surface is also of advantage.

Although the foregoing embodiments and examples have been described in conjunction with germanium, it will be understood that other semiconductor materials, for example silicon or semiconducting compounds, are likewise applicable. Furthermore, the production of the collector zone is not limited to the epitaxial technique but may also be performed in any other suitable manner, for example by pulling a corresponding zone sequence out of a melt.

In FIG. 1 the current values denoted by $I_1$ and $I_3$ on the abscissa are proportional to the collector current at maximal power amplification. The values denoted by $I_2$ and $I_4$ are proportional to the collector current at a power amplification of −20 db. With regulating transistors that possess an inhomogeneously injecting emitter area, the ratio of $I_2$ to $I_1$ becomes larger than the ratio $I_4$ to $I_3$.

FIG. 12 shows a measuring network by means of which the regulating and amplifying properties of an HF-regulating transistor according to the invention have been ascertained for use with the input stages of television receivers. Denoted by T is the transistor to be tested. It is shown connected in common base configuration. The input E receives the signal of the useful transmitter at a frequency of 200 mc.p.s. non-modulated, as well as the spurious signal of the interfering transmitter at a carrier frequency of 210 mc.p.s. which is 100% amplitude modulated with 1 c.p.s. The total input resistance is 60 ohm. The useful transmitter signal at the output A is 1% AM modulated by the spurious signal. The load resistance $R_A$ is 60 ohm and is transformed through capacitor $C_2$ to $R_L=900$ ohm. The battery voltage, applied between the two terminals B and serving as collector voltage, is 12 v. Collector current and collector voltage are controllable by means of a resistor $R_1$ which forms a voltage divider for the collector voltage. The emitter current passes through a resistor $R_2$. The network further comprises coupling capacitors $C_1$, $C_2$, a blocking capacitor $C_3$, and a filter composed of capacitors $C_4$, $C_5$ and inductance L.

FIG. 13 represents the curve of the power amplification and the permissible spurious voltage as a function of the collector current ascertained with the aid of a circuit according to FIG. 12 for a transistor as described above in conjunction with FIG. 3. As will be seen from FIG. 13, the curvature of the amplification characteristic is relatively slight, whereas the permissible spurious voltage U is relative high. Also significant is the fact that the permissible spurious voltage U steeply increases with decreasing amplification P. A similar course of gain and permissible spurious voltage has been ascertained with an inhomogeneous doping of the base zone parallel to the crystal surface.

As explained, the inhomogeneous injection through the emitter area displaces the amplification maximum of the transistor towards lower collector currents. For that reason, such transistors also afford reducing the specimen stray of the collector current for a given negative power amplification; that is, the differences between the transistors issuing from the same manufacturing facilities can be minimized in this manner. With transistors whose maximal power amplification occurs at low collector currents, the collector current for a given, relatively large attenuation can be limited by external circuit components virtually without impairment of the cross-modulation behavior. Thus, an optimal regulating track can be adjusted by adjustment of the battery voltage or by correspondingly selecting or setting the emitter resistance or collector resistance.

We claim:

1. In a regulating transistor having a crystalline semiconductor body including an emitter zone and a base zone and a collector zone, said collector zone having adjacent to said base zone a high-resistivity region; means for injecting charge-carrier non-uniformly from the emitter zone into the base zone, said means comprising a junction between the emitter zone and the base zone extending over the area of charge-carrier injection between the emitter zone and the base zone; and an emitter electrode joined with said emitter zone in the form of at least one elongated strip, said emitter-electrode strip having non-uniform width along its length, said emitter zone being formed of a diffusion zone containing dopant metal from said electrode having a given diffusion depth, said electrode strip having at its narrow localities a width only slightly larger than the given diffusion depth of said dopant metal, so that the base zone between the respective emitter and collector p-n junctions likewise varies in width along the length of the strip.

2. In a regulating transistor having a crystalline semiconductor body including an emitter zone and a base zone and a collector zone, said collector zone having adjacent to said base zone a high-resistivity region; and means for injecting charge-carrier non-uniformly from the emitter zone into the base zone, said means comprising a junction between the emitter zone and the base zone extending over the area of charge-carrier injection between the emitter zone and the base zone, said emitter zone being wedge-shaped and tapering in thickness along the area of said junction.

3. In a regulating transistor having a crystalline semiconductor body including an emitter zone and a base zone and a collector zone, said collector zone having adjacent to said base zone a high-resistivity region; and means for injecting charge-carrier non-uniformly from the emitter zone into the base zone, said means comprising a junction between the emitter zone and the base zone extending over the area of charge-carrier injection between the emitter zone and the base zone, said base zone having a concave shape, said junction area having greater penetrating depth in the middle of said shape than toward the margins thereof.

4. In a regulating transistor having a crystalline semiconductor body including an emitter zone and a base zone and a collector zone, said collector zone having adjacent to said base zone a high-resistivity region; and means for injecting charge-carrier non-uniformly from the emitter zone into the base zone, said means comprising a junction between the emitter zone and the base zone extending over the area of charge-carrier injection between the emitter zone and the base zone, said junction area having a saw-tooth shape.

5. In a regulating transistor having a crystalline semiconductor body including an emitter zone and a base zone and a collector zone, said collector zone having adjacent to said base zone a high-resistivity region; and means for injecting charge-carrier non-uniformly from the emitter zone into the base zone, said means comprising a junction between the emitter zone and the base zone extending over the area of charge-carrier injection between the emitter zone and the base zone, said base zone having at least at said injecting area a non-uniform dopant concentration in a direction parallel to the semiconductor surface, said dopant concentration in said base zone having a periodic variation in said parallel direction.

6. In a regulating transistor having a crystalline semiconductor body including an emitter zone and a base zone and a collector zone, said collector zone having adjacent to said base zone a high-resistivity region; and means for injecting charge-carrier non-uniformly from the emitter zone into the base zone, said means comprising a junction between the emitter zone and the base zone extending over the area of charge-carrier injection between the emitter zone and the base zone, said base zone having at least at said injecting area a non-uniform dopant concentration in a direction parallel to the semiconductor surface, said base zone and said collector zone having a p-n junction therebetween of sawtooth configuration.

References Cited

UNITED STATES PATENTS

| | | |
|---|---|---|
| 3,277,351 | 10/1966 | Osafune. |
| 2,849,664 | 8/1958 | Beale. |
| 3,166,448 | 1/1965 | Hubner. |
| 3,316,131 | 4/1967 | Wisman. |

JOHN W. HUCKERT, Primary Examiner

M. EDLOW, Assistant Examiner

U.S. Cl. X.R.

317—235